United States Patent
Oota et al.

(10) Patent No.: US 10,155,886 B2
(45) Date of Patent: Dec. 18, 2018

(54) POLISHING LIQUID FOR CMP, AND POLISHING METHOD

(71) Applicant: HITACHI CHEMICAL COMPANY, LTD., Tokyo (JP)

(72) Inventors: Munehiro Oota, Tokyo (JP); Toshio Takizawa, Tokyo (JP); Hisataka Minami, Tokyo (JP); Toshiaki Akutsu, Tokyo (JP); Tomohiro Iwano, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 344 days.

(21) Appl. No.: 14/897,771

(22) PCT Filed: Apr. 28, 2014

(86) PCT No.: PCT/JP2014/061847
§ 371 (c)(1),
(2) Date: Dec. 11, 2015

(87) PCT Pub. No.: WO2014/199739
PCT Pub. Date: Dec. 18, 2014

(65) Prior Publication Data
US 2016/0137881 A1 May 19, 2016

(30) Foreign Application Priority Data
Jun. 12, 2013 (JP) ................. 2013-123824

(51) Int. Cl.
*B24B 1/00* (2006.01)
*B24B 37/04* (2012.01)
(Continued)

(52) U.S. Cl.
CPC .............. *C09G 1/02* (2013.01); *B24B 37/044* (2013.01); *C09K 3/1409* (2013.01);
(Continued)

(58) Field of Classification Search
CPC .......... B24B 1/00; B24B 37/04; B24B 37/00; B24B 37/044; C09K 3/14; C09G 3/02; H01L 21/304
(Continued)

(56) References Cited

U.S. PATENT DOCUMENTS 9,163,162 B2 * 10/2015 Akutsu ............... C09K 3/1409
2012/0315763 A1 12/2012 Hanano et al.

FOREIGN PATENT DOCUMENTS

CN 102017091 A 4/2011
CN 102127370 A 7/2011
(Continued)

OTHER PUBLICATIONS

Office Action of JP Appln. No. P2014-532891 dated Oct. 18, 2016.
(Continued)

*Primary Examiner* — Robert Rose
(74) *Attorney, Agent, or Firm* — Fitch, Even, Tabin & Flannery, LLP

(57) ABSTRACT

A polishing liquid for CMP, comprising: an abrasive grain including a cerium-based compound; a 4-pyrone-based compound; a polymer compound having an aromatic ring and a polyoxyalkylene chain; a cationic polymer; and water.

11 Claims, 1 Drawing Sheet

(51) Int. Cl.
  *C09G 1/02* (2006.01)
  *H01L 21/3105* (2006.01)
  *C09K 3/14* (2006.01)
  *H01L 21/762* (2006.01)

(52) U.S. Cl.
  CPC ...... *C09K 3/1463* (2013.01); *H01L 21/31053* (2013.01); *H01L 21/76229* (2013.01)

(58) Field of Classification Search
  USPC .............................. 451/57, 41, 28; 252/79.1
  See application file for complete search history.

(56) References Cited

FOREIGN PATENT DOCUMENTS

| | | |
|---|---|---|
| CN | 102149783 A | 8/2011 |
| CN | 102318042 A | 1/2012 |
| JP | H8-022970 A | 1/1996 |
| JP | H10-106994 A | 4/1998 |
| JP | 2006-249129 A | 9/2006 |
| JP | 2008-177180 A | 7/2008 |
| JP | 2008-288537 A | 11/2008 |
| JP | 2009-290126 A | 12/2009 |
| JP | 2010-095650 A | 4/2010 |
| JP | 2011-530166 A | 12/2011 |
| JP | 2012-084906 A | 4/2012 |
| JP | 2013-038211 A | 2/2013 |
| WO | 99/031195 A1 | 6/1999 |
| WO | 02/067309 A1 | 8/2002 |
| WO | 2009/131133 A1 | 10/2009 |
| WO | 2010/067844 A1 | 6/2010 |
| WO | 2010/143579 A1 | 12/2010 |
| WO | 2011/081109 A1 | 7/2011 |
| WO | 2012/070541 A1 | 5/2012 |
| WO | 2012/070542 A1 | 5/2012 |
| WO | 2012/070544 A1 | 5/2012 |
| WO | 2013/125441 A1 | 8/2013 |
| WO | 2013/125446 A1 | 8/2013 |

OTHER PUBLICATIONS

International Search Report for PCT/JP2013/061847 dated Jul. 15, 2014; English Translation submitted herewith (5 Pages).
International Preliminary Report on Patentability for PCT/JP2013/070619 dated Mar. 3, 2015 (4 Pages).
Written Opinion of the International Searching Authority for PCT/JP2013/070619 dated Oct. 29, 2013.; English Translation submitted herewith (6 Pages).
Office Action for Chinese Application No. 201380045013.4 dated Dec. 29, 2015 (5 Pages).
Notice of Allowance from U.S. Appl. No. 14/424,970 dated Aug. 4, 2015.
International Preliminary Report on Patentability for PCT/JP2014/081847 dated Dec. 23, 2015.

\* cited by examiner (a)
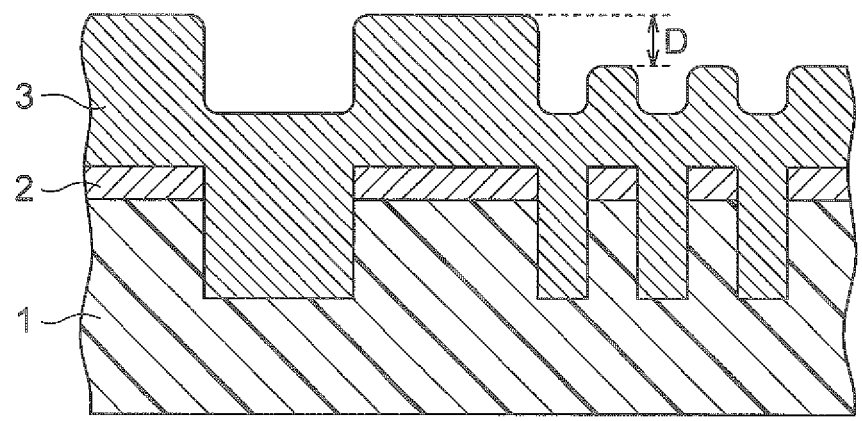
(b)
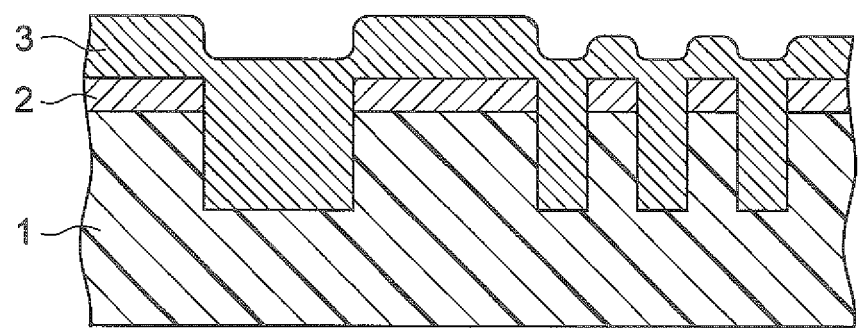
(c)
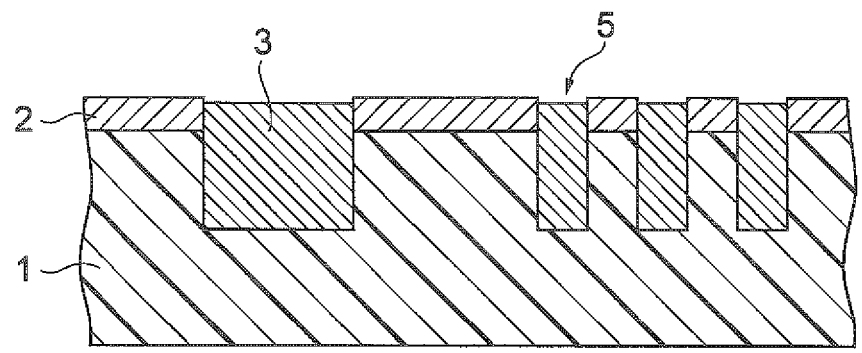

POLISHING LIQUID FOR CMP, AND POLISHING METHOD

TECHNICAL FIELD

The present invention relates to a polishing liquid for CMP, and a polishing method. The present invention relates, in particular, to a polishing liquid used for chemical mechanical polishing (CMP) of semiconductor wafer materials, and a polishing method using the same. The present invention relates to, for example, a polishing liquid for polishing an insulating material such as silicon oxide, provided on the surface of a semiconductor wafer, and a polishing method using the same.

BACKGROUND ART

In the field of semiconductor production, with achievement of high performance of ultra LSI devices, a miniaturization technology as an extension of the conventional technology finds restriction in allowing high integration and speed-up to be compatible with each other. Accordingly, techniques for allowing vertical high integration while miniaturization of semiconductor elements is being promoted, namely, techniques for developing multilayered wiring have been developed.

In the process for producing a device comprising multilayered wiring, one of the most important techniques is a CMP technique. The CMP technique is a technique in which a thin film is formed on a substrate by, for example, chemical vapor deposition (CVD), and then its surface is flattened. For example, a treatment based on CMP is indispensable for the purpose of securing the depth of focus in lithography. When the substrate surface has irregularities, there occur, for example, such troubles that the focusing in an exposure step is precluded, or fine wiring structure cannot be sufficiently formed. The CMP technique is applied, in a production process of a device, to a step of forming an element isolation region by polishing a plasma oxide material (for example, BPSQ HDP-$SiO_2$, or p-TEOS), a step of forming an interlayer insulating material, or a step of flattening a plug (for example, Al·Cu plug) after a silicon oxide-containing member (for example, a silicon oxide film) is embedded in a metal wiring.

CMP is usually performed using an apparatus capable of supplying a polishing liquid to a polishing pad. The substrate surface is polished by pressing the substrate against the polishing pad and by moving at least one of the substrate and the polishing pad while a polishing liquid is being supplied between the substrate surface and the polishing pad. In the CMP technique, a high-performance polishing liquid is one of the essential technologies, and various polishing liquids have hitherto been developed (for example, see following Patent Literature 1).

CITATION LIST

Patent Literature

Patent Literature 1: Japanese Patent Application Laid-Open No. 2008-288537

SUMMARY OF INVENTION

Technical Problem

In a step of forming an element isolation region on the substrate, a groove is beforehand formed on the substrate surface, and an insulating material (for example, silicon oxide) is formed by, for example, CVD so as to fill the groove. Subsequently, the surface of the insulating material is flattened by CMP to form an element isolation region. In the case where the insulating material is formed on the substrate of which an element isolation structure such as a groove is provided on the surface, the irregularities corresponding to the irregularities of the element isolation structure also occur on the surface of the insulating material. In the polishing of the surface having irregularities, while a convex region is preferentially removed, a concave region is slowly removed to flatten the surface.

For the purpose of enhancing the throughput of the semiconductor production, it is preferable that the unnecessary portion of the insulating material formed on the substrate is removed as rapidly as possible and the polishing is certainly stopped with a stopper (polishing stop layer constituted with a stopper material). For example, in the case where shallow trench isolation (STI) is adopted in order to respond to the achievement of the narrow width of the element isolation region, it is required that the unnecessary portion of the insulating material provided on the substrate is removed at a high polishing rate and the polishing is stopped with a stopper.

However, when using a conventional polishing liquid for CMP having the rapid polishing rate of an insulating material such as silicon oxide, the surface to be polished after the completion of polishing is generally coarse and tends to be poor in flatness. Therefore, there is a case where the enhancement of the production efficiency is achieved by dividing the polishing treatment of the insulating material into two stages, and by using polishing liquids different in type from each other in the respective steps. In the first polishing step (coarse polishing step), a polishing liquid having the high polishing rate of the insulating material is used to remove most of the insulating material. In the second polishing step (finishing step), the insulating material is removed until the stopper is exposed, and the polished surface is finished so as to be sufficiently flat.

The characteristics required for the first polishing step and the characteristics required for the second polishing step are different, and hence the polishing liquids adapted to the respective steps are required to be selected. However, in the case where the same polishing liquid is used both in the first polishing step and in the second polishing step, the required characteristics of either of the two steps have hitherto been made a compromise, and thus there has been required a polishing liquid sufficiently satisfying the characteristics of both of the first polishing step and the second polishing step.

The present invention is directed to solve the above problems, and an object thereof is to provide a polishing liquid for CMP capable of achieving a high polishing rate of an insulating material and a high stopping property of a stopper material (low polishing rate of stopper material), and a polishing method using the polishing liquid for CMP.

Solution to Problem

The present inventors made a diligent study on the additives to be included in the polishing liquid for CMP in order to solve the above problems. The present inventors prepared polishing liquids using various organic compounds as additives, and the insulating material and the stopper material were polished using these polishing liquids, and the polishing rates were evaluated. As a result, the present inventors have perfected the present invention by finding that a combination of specific three additives allows a high polishing rate of an insulating material and a high stopping property of a stopper material to be compatible with each other.

The polishing liquid for CMP of the present invention comprises an abrasive grain including a cerium-based compound, a 4-pyrone-based compound represented by the following general formula (I), a polymer compound having an aromatic ring and a polyoxyalkylene chain, a cationic polymer and water.

[Chemical Formula 1]

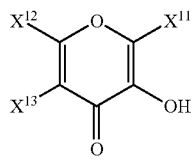

(I)

[In formula (I), $X^{11}$, $X^{12}$ and $X^{13}$ are each independently a hydrogen atom or a monovalent substituent.]

According to the polishing liquid for CMP of the present invention, a high polishing rate of an insulating material can be obtained. According to the polishing liquid for CMP of the present invention, the polishing rate of a stopper material can be suppressed, and a high stopping property of the stopper material can be obtained. According to such a polishing liquid for CMP, it is possible to enhance the polishing selectivity (polishing rate ratio: polishing rate of insulating material/polishing rate of stopper material) of the insulating material with respect to the stopper material.

It is preferable that the zeta potential of the abrasive grain in the polishing liquid for CMP of the present invention is positive. This facilitates the achievement of a high polishing rate of the insulating material and a high stopping property of the stopper material.

It is preferable that the 4-pyrone-based compound is at least one selected from the group consisting of 3-hydroxy-2-methyl-4-pyrone, 5-hydroxy-2-(hydroxymethyl)-4-pyrone and 2-ethyl-3-hydroxy-4-pyrone. This facilitates the achievement of a high polishing rate of the insulating material and a high stopping property of the stopper material.

The polishing liquid for CMP of the present invention may further comprise a saturated monocarboxylic acid. This enables to further enhance the polishing rate of the insulating material.

It is preferable that the number of the carbon atoms of the saturated monocarboxylic acid is 2 to 6. This enables to further enhance the polishing rate of the insulating material.

It is preferable that the saturated monocarboxylic acid is at least one selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid. This enables to further enhance the polishing rate of the insulating material.

The polishing liquid for CMP of the present invention is preserved with being separated to a first liquid and a second liquid, the first liquid contains at least the abrasive grain and water, and the second liquid contains at least the polymer compound, the cationic polymer and water.

The polishing method of the present invention comprises a step of polishing a base substrate having an insulating material by using the polishing liquid. According to such a polishing method, a high polishing rate of an insulating material and a high stopping property of a stopper material can be achieved.

Advantageous Effects of Invention

According to the present invention, there is provided a polishing liquid for CMP capable of achieving a high polishing rate of an insulating material (for example, silicon oxide) and a high stopping property of a stopper material (for example, polysilicon). According to the present invention, a polishing method using the polishing liquid is also provided.

According to the present invention, an use of the polishing liquid for polishing of a semiconductor wafer material is provided. According to the present invention, an use of the polishing liquid for polishing of an insulating material is provided. According to the present invention, an use of the polishing liquid for polishing of silicon oxide is provided. According to the present invention, an use of the polishing liquid for selective polishing of an insulating material with respect to the stopper material is provided.

BRIEF DESCRIPTION OF DRAWINGS

FIG. 1 is a schematic cross-sectional view illustrating the process for forming a shallow trench isolation structure on a semiconductor substrate.

DESCRIPTION OF EMBODIMENTS

Hereinafter, an embodiment of the present invention is described. Herein, in present Description, a numerical range represented by using "to" means a range including the numerical values presented before and after "to" as the minimum value and the maximum value, respectively. In addition, in the case where a plurality of substances corresponding to each of the components is present in a composition, unless otherwise specified, the content of each of the components in the composition means the total amount of the plurality of substances present in the composition.

<Polishing Liquid for CMP>

The polishing liquid for CMP of the present embodiment comprises an abrasive grain including a cerium-based compound, at least three types of additives, and water. The polishing liquid for CMP of the present embodiment comprises a 4-pyrone-based compound having a specific structure as a first additive, comprises a polymer compound having an aromatic ring and a polyoxyalkylene chain (hereinafter, referred to as "aromatic polyoxyalkylene compound") as a second additive, and comprises a cationic polymer as a third additive. Hereinafter, the respective components are described.

(First Additive: 4-Pyrone-Based Compound)

The polishing liquid for CMP of the present embodiment comprises a 4-pyrone-based compound represented by the following general formula (I) as a first additive. This develops the enhancement effect of the polishing rate of the insulating material. The 4-pyrone-based compound has at least a structure in which a hydroxy group is bonded to a carbon atom adjacent to the carbon atom of the carbonyl group. Herein, the 4-pyrone-based compound is a heterocyclic compound having a six-membered ring (γ-pyrone ring) structure which includes an oxy group and a carbonyl group, and also the carbonyl group is located at the 4-position relative to the oxy group. In the 4-pyrone-based compound of the present embodiment, a hydroxy group is bonded to the carbon atom adjacent to the carbonyl group of this γ-pyrone ring, and a hydrogen atom or a substituent other than a hydrogen atom may be substituted to the other carbon atoms.

[Chemical Formula 2]

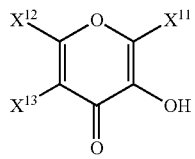
(I)

[In formula (I), $X^{11}$, $X^{12}$ and $X^{13}$ are each independently a hydrogen atom or a monovalent substituent.]

Examples of the monovalent substituent include an aldehyde group, a hydroxy group, a carboxyl group, a sulfonate group, a phosphate group, bromine, chlorine, iodine, fluorine, a nitro group, a hydrazine group, an alkyl group (may be substituted with OH, COOH, Br, Cl, I or $NO_2$) having 1 to 8 carbon atoms, a hydroxyalkyl group, an aryl group having 6 to 12 carbon atoms, and an alkenyl group having 1 to 8 carbon atoms. As the monovalent substituent, a methyl group, an ethyl group, and a hydroxymethyl group are preferable.

In the case where the 4-pyrone-based compound has a monovalent substituent, it is preferable that the substituent is bonded to a carbon atom adjacent to the oxy group from the viewpoint that the synthesis is simple. That is, it is preferable that $X^{11}$ and/or $X^{12}$ is a substituent. In addition, from the viewpoint of facilitating the achievement of the enhancement effect of the polishing capability of an abrasive grain including a cerium-based compound, it is preferable at least two of $X^{11}$, $X^{12}$ and $X^{13}$ be hydrogen atoms, and it is more preferable that two of $X^{11}$, $X^{12}$ and $X^{13}$ are hydrogen atoms.

It is preferable that the 4-pyrone-based compound is at least one selected from the group consisting of 3-hydroxy-2-methyl-4-pyrone (another name: 3-hydroxy-2-methyl-4H-pyran-4-one), 5-hydroxy-2-(hydroxymethyl)-4-pyrone (another name: 5-hydroxy-2-(hydroxymethyl)-4H-pyran-4-one), and 2-ethyl-3-hydroxy-4-pyrone (another name: 2-ethyl-3-hydroxy-4H-pyran-4-one). 4-pyrone-based compound may be used alone or in combination of two or more.

It is preferable that the 4-pyrone-based compound is water soluble. By using a compound having high solubility in water, an desired amount of an additive can be satisfactorily dissolved in the polishing liquid, and the enhancement effect of the polishing rate and the suppression effect of the aggregation of the abrasive grain can be obtained at further higher levels. The solubility of the 4-pyrone-based compound in 100 g of water at normal temperature (25° C.) is preferably 0.001 g or more, more preferably 0.005 g or more, further preferably 0.01 g or more and particularly preferably 0.05 g or more. Herein, the upper limit of the solubility is not particularly limited.

The content of the first additive is preferably 0.01 mass % or more, more preferably 0.02 mass % or more, further preferably 0.03 mass % or more, particularly preferably 0.04 mass % or more, extremely preferably 0.05 mass % or more based on the total mass of the polishing liquid for CMP. In the case where the content of the first additive is 0.01 mass % or more, a stable polishing rate is more easily achieved as compared with the case where the content of the first additive is less than 0.01 mass %. The content of the first additive is preferably 5 mass % or less, more preferably 1 mass % or less, further preferably 0.5 mass % or less, particularly preferably 0.1 mass % or less based on the total mass of the polishing liquid for CMP. In the case where the content of the first additive is 5 mass % or less, the aggregation of the abrasive grain is more easily suppressed and a high polishing rate is more easily achieved as compared with the case where the content of the first additive exceeds 5 mass %.

(Second Additive: Aromatic Polyoxyalkylene Compound)

The aromatic polyoxyalkylene compound has an effect of inhibiting the polishing rate of the stopper material from being excessively increased. The reason why such effects are exerted is presumed as follows: the aromatic polyoxyalkylene compound covers the stopper material to thereby suppress polishing of the stopper material. Such an effect is more remarkably achieved in the case where the stopper material is polysilicon.

The aromatic polyoxyalkylene compound is a compound in which a substituent having an aromatic ring is introduced to the terminal of a polyoxyalkylene. The aromatic ring may be directly bound or not be directly bound to the polyoxyalkylene chain. The aromatic ring may be a monocyclic or polycyclic. In addition, the aromatic polyoxyalkylene compound may have a structure in which a plurality of polyoxyalkylene chains is bonded via a substituent having an aromatic ring. The polyoxyalkylene chain is preferably a polyoxyethylene chain, a polyoxypropylene chain or a polyoxyethylene-polyoxypropylene chain from the viewpoint that the synthesis is simple. The number of structure units in the polyoxyalkylene chain (the number of structure units of the oxyalkylene structure) is preferably 15 or more from the viewpoint of efficiently covering the stopper material.

Examples of the substituent having an aromatic ring include an aryl group, in the case where the aromatic ring is positioned at the terminal of the aromatic polyoxyalkylene compound. Examples of the aryl group include monocyclic aromatic groups such as a phenyl group, a benzyl group, a tolyl group and a xylyl group; and polycyclic aromatics such as a naphthyl group, and such aromatic groups may further have a substituent. Examples of the substituent introduced to the aromatic group include an alkyl group, a vinyl group, an allyl group, an alkenyl group, an alkynyl group, an alkoxy group, a halogeno group, a hydroxy group, a carbonyl group, a nitro group, an amino group, a styrene group and an aromatic group, and an alkyl group and a styrene group are preferable from the viewpoint of efficiently covering the stopper material.

Examples of the substituent having an aromatic ring include an arylene group, in the case where the aromatic ring is positioned in the main chain of the aromatic polyoxyalkylene compound. Examples of the arylene group include monocyclic aromatic groups such as a phenylene group, a tolylene group and a xylylene group; and polycyclic aromatics such as a naphthylene group, and such aromatic groups may further have a substituent. Examples of the substituent introduced to the aromatic group include an alkyl group, a vinyl group, an allyl group, an alkenyl group, an alkynyl group, an alkoxy group, a halogeno group, a hydroxy group, a carbonyl group, a nitro group, an amino group, a styrene group and an aromatic group.

It is preferable that the aromatic polyoxyalkylene compound is a compound represented by the following general formula (II) or the following general formula (III) from the viewpoint of efficiently covering the stopper material.

$$R^{11}-O-(R^{12}-O)_m-H \quad \text{(II)}$$

[In formula (II), $R^{11}$ represents an aryl group which may have a substituent, $R^{12}$ represents an alkylene group having 1 to 5 carbon atoms, which may have a substituent, and m represents an integer of 15 or more.]

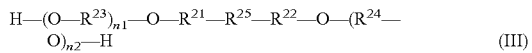

(III)

[In formula (III), $R^{21}$ and $R^{22}$ each independently represent an arylene group which may have a substituent, $R^{23}$, $R^{24}$ and $R^{25}$ each independently represent an alkylene group having 1 to 5 carbon atoms, which may have a substituent, and n1 and n2 each independently represent an integer of 15 or more.]

From the viewpoint of further enhancing the polishing selectivity of the insulating material with respect to the stopper material, it is preferable that the formula (II) or formula (III) satisfies at least one of the following conditions.

- $R^{11}$ is preferably the aryl group shown as an example of a substituent having an aromatic ring, more preferably a phenyl group to which a styrene group or an alkyl group is introduced as a substituent.
- $R^{21}$ and $R^{22}$ are preferably the arylene group shown as an example of a substituent having an aromatic ring.
- $R^{12}$, $R^{23}$, $R^{24}$ and $R^{25}$ are preferably an ethylene group or a n-propylene group.
- m is preferably 15 or more, more preferably 30 or more.
- m is preferably 20000 or less, more preferably 10000 or less, further preferably 5000 or less, particularly preferably 1000 or less.
- n1 and n2 are preferably 15 or more, more preferably 30 or more.
- n1 and n2 are preferably 20000 or less, more preferably 10000 or less, further preferably 5000 or less, particularly preferably 1000 or less.

Examples of the aromatic polyoxyalkylene compound represented by the formula (II) include polyoxyalkylene phenyl ether, polyoxyalkylene alkylphenyl ether, polyoxyalkylene styrenated-phenyl ether, polyoxyalkylene cumylphenyl ether, and polyoxyalkylene benzyl ether. Specifically, examples of the aromatic polyoxyalkylene compound represented by the formula (II) include polyoxyethylene alkylphenyl ether (for example, Emulsit series produced by Dai-Ichi Kogyo Seiyaku Co., Ltd.), polyoxyethylene nonylpropenylphenyl ether (for example, Aqualon RN series produced by Dai-Ichi Kogyo Seiyaku Co., Ltd.), polyoxyethylene phenyl ether, polyoxyethylene styrenated-phenyl ether (for example, Emulgen A-500 produced by Kao Corporation; and Noigen EA-7 series produced by Dai-Ichi Kogyo Seiyaku Co., Ltd.), polyoxypropylene phenyl ether, polyoxyethylene cumylphenyl ether, and polyoxyethylene benzyl ether. Examples of the aromatic polyoxyalkylene compound represented by the formula (III) include 2,2-bis (4-polyoxyethylene oxyphenyl)propane.

Aromatic polyoxyalkylene compound can be used alone or in combination of two or more for the purpose of adjusting polishing characteristics such as polishing selectivity and flatness.

The lower limit of the weight average molecular weight of the aromatic polyoxyalkylene compound is preferably 1000 or more, more preferably 1500 or more, further preferably 2000 or more, particularly preferably 4000 or more, from the viewpoint that the polishing selectivity is further excellent. The upper limit of the weight average molecular weight of the aromatic polyoxyalkylene compound is preferably 1000000 or less, more preferably 500000 or less, further preferably 250000 or less, particularly preferably 100000 or less, extremely preferably 50000 or less, very preferably 10000 or less, from the viewpoint that the polishing selectivity is further excellent.

Herein, the weight average molecular weight of the aromatic polyoxyalkylene compound can be measured, for example, by the gel permeation chromatography method (GPC) under the following conditions using the calibration curve of standard polystyrene.

Instrument used: Hitachi L-6000 Model [manufactured by Hitachi Ltd.]
Column: Gel-Pak GL-R420+Gel-Pak GL-R430+Gel-Pak GL-R440 [Hitachi Chemical Co., Ltd., trade names, three columns in total]
Eluent: tetrahydrofuran
Measurement temperature: 40° C.
Flow rate: 1.75 mL/min
Detector: L-3300RI [manufactured by Hitachi Ltd.]

The content of the aromatic polyoxyalkylene compound is preferably 0.01 mass % or more based on the total mass of the polishing liquid for CMP. This enables to further suppress the polishing rate of the stopper material. From the same viewpoint, the lower limit of the content of the aromatic polyoxyalkylene compound is more preferably 0.05 mass % or more, further preferably 0.1 mass % or more, particularly preferably 0.2 mass % or more based on the total mass of the polishing liquid for CMP. The upper limit of the content of the aromatic polyoxyalkylene compound is not particularly limited, but is preferably 10.0 mass % or less, more preferably 5.0 mass % or less, further preferably 3.0 mass % or less, particularly preferably 2.0 mass % or less, extremely preferably 1.0 mass % or less from the viewpoint that stability and productivity are excellent.

(Third Additive: Cationic Polymer)

The polishing liquid for CMP of the present embodiment comprises a cationic polymer as a third additive other than the first additive (4-pyrone-based compound) and the second additive (aromatic polyoxyalkylene compound). That is, as the third additive, the compounds corresponding to the first additive or the second additive are excluded. The "cationic polymer" is defined as a polymer having a cation group or a group which can be ionized to a cation group in the main chain or a side chain. Examples of the cation group include an amino group, an imino group and a cyano group.

The cationic polymer is used in combination with the aromatic polyoxyalkylene compound to thereby exert the effect of inhibiting the polishing rate of the stopper material from being excessively increased. Also, the cationic polymer can inhibit reduction in the polishing rate of the insulating material caused by the excessive covering of the insulating material in addition to the stopper material with the aromatic polyoxyalkylene compound, and there is also exerted the effect of enhancing the polishing rate of the insulating material. Therefore, in the case where the aromatic polyoxyalkylene compound and the cationic polymer are used in combination, it is considered that the cationic polymer can interact with the aromatic polyoxyalkylene compound to thereby not only suppress the polishing rate of the stopper material but also enhance the polishing rate of the insulating material.

Examples of the cationic polymer include polymers (an allylamine polymer, a diallylamine polymer, a vinylamine polymer and an ethyleneimine polymer) obtained by polymerizing at least one monomer component selected from the group consisting of allylamine, diallylamine, vinylamine, ethyleneimine and their derivatives, and polysaccharides such as chitosan and chitosan derivatives.

The allylamine polymer is a polymer obtained by polymerizing allylamine or a derivative thereof.

Examples of the allylamine derivative include alkoxycarbonylated allylamines, methylcarbonylated allylamines, aminocarbonylated allylamines and ureated allylamines.

The diallylamine polymer is a polymer obtained by polymerizing diallylamine or a derivative thereof. Examples of the diallylamine derivative include methyldiallylamines, a diallyldimethylammonium salt, a diallylmethylethylammonium salt, acylated diallylamines, aminocarbonylated diallylamines, alkoxycarbonylated diallylamines, aminothiocarbonylated diallylamines and hydroxyalkylated diallylamines Examples of the ammonium salt include ammonium chloride and ammonium alkyl sulfate (for example, ammonium ethyl sulfate).

The vinylamine polymer is a polymer obtained by polymerizing vinylamine or a derivative thereof. Examples of the vinylamine derivative include alkylated vinylamines, amidated vinylamines, ethylene oxidized vinylamines, propylene oxidized vinylamines, alkoxylated vinylamines, carboxymethylated vinylamines, acylated vinylamines and ureated vinylamines.

The ethyleneimine polymer is a polymer obtained by polymerizing ethyleneimine or a derivative thereof. Examples of the ethyleneimine derivative include an aminoethylated acrylic polymer, alkylated ethyleneimines, ureated ethyleneimines and propylene oxidized ethyleneimines.

The cationic polymer may have a structure unit derived from a monomer component other than allylamine, diallylamine, vinylamine, ethyleneimine and their derivatives. The cationic polymer may have, for example, a structure unit derived from acrylamide, dimethylacrylamide, diethylacrylamide, hydroxyethylacrylamide, acrylic acid, methyl acrylate, methacrylic acid, maleic acid, sulfur dioxide or the like.

The cationic polymer may be a homopolymer of allylamine, diallylamine, vinylamine or ethyleneimine (polyallylamine, polydiallylamine, polyvinylamine or polyethyleneimine), or may be a copolymer having a structure unit derived from allylamine, diallylamine, vinylamine, ethyleneimine or their derivative. In the copolymer, the arrangement of the structure unit is arbitrary. For example, any form such as (a) a block copolymerization form in which the same type structure units are respectively continued, (b) a random copolymerization form in which a structure unit A and a structure unit B are arranged without being ordered, or (c) an alternating copolymerization form in which a structure unit A and a structure unit B are alternately arranged can be adopted.

The copolymer is preferably a copolymer obtained by polymerizing a composition containing acrylamide as a monomer component, more preferably a copolymer obtained by polymerizing a composition containing a diallyldimethylammonium salt and acrylamide as monomer components, further preferably a diallyldimethylammonium chloride-acrylamide copolymer, from the viewpoint of further enhancing the polishing selectivity of the insulating material with respect to the stopper material.

Among the above cationic polymers, from the viewpoint of further enhancing the polishing selectivity of the insulating material with respect to the stopper material and from the viewpoint of further enhancing the polishing rate of the insulating material, an amine polymer which is a polymer obtained by polymerizing allylamine, diallylamine, vinylamine or the like is preferable. Cationic polymer can be used alone or in combination of two or more for the purpose of adjusting polishing characteristics such as polishing selectivity and flatness.

The lower limit of the weight average molecular weight of the cationic polymer is preferably 100 or more, more preferably 300 or more, further preferably 500 or more, from the viewpoint of further enhancing the polishing selectivity of the insulating material with respect to the stopper material. The upper limit of the weight average molecular weight of the cationic polymer is preferably 1000000 or less, more preferably 600000 or less, further preferably 300000 or less, from the viewpoint of further enhancing the polishing selectivity of the insulating material with respect to the stopper material. Herein, the weight average molecular weight of the cationic polymer can be measured by the same method as in the weight average molecular weight of the second additive.

The lower limit of the content of the cationic polymer is preferably 0.00001 mass % or more, more preferably 0.00003 mass % or more, further preferably 0.00005 mass % or more based on the total mass of the polishing liquid for CMP, from the viewpoint of further enhancing the polishing selectivity and flatness. The upper limit of the content of the cationic polymer is preferably 5 mass % or less, more preferably 1 mass % or less, further preferably 0.1 mass % or less, particularly preferably 0.01 mass % or less, extremely preferably 0.005 mass % or less, very preferably 0.001 mass % or less, particularly preferably 0.0005 mass % or less based on the total mass of the polishing liquid for CMP, from the viewpoint that the polishing selectivity is further excellent. It is preferable that the content of the cationic polymer is appropriately adjusted depending on the preparation method of the insulating material (type and film formation conditions) from the viewpoint of further enhancing the polishing rate of the insulating material, the polishing selectivity of the insulating material with respect to the stopper material, and flatness.

(Fourth Additive: Saturated Monocarboxylic Acid)

The polishing liquid for CMP of the present embodiment may further comprise a saturated monocarboxylic acid as a fourth additive. This enables to further enhance the polishing rate of the insulating material.

The number of the carbon atoms of the saturated monocarboxylic acid is preferably 2 to 6 from the viewpoint of further enhancing the polishing rate of the insulating material. It is preferable that the saturated monocarboxylic acid is at least one selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid. Herein, as the saturated monocarboxylic acid, these compounds may be used singly or in combinations of two or more. The number of the carbon atoms of the saturated monocarboxylic acid is more preferably 3 or more from the viewpoint that the polishing rate of the insulating material is further excellent. From the viewpoint of being satisfactory in water solubility, easy to use, inexpensive and easily available, a saturated monocarboxylic acid having 2 or 3 carbon atoms is preferable, and specifically acetic acid and propionic acid are preferable. From the above, propionic acid is particularly preferable from the viewpoint of balancing among the polishing rate, water solubility, easy availability and the like.

The content of the saturated monocarboxylic acid is preferably 0.001 mass % or more, more preferably 0.005 mass % or more, further preferably 0.01 mass % or more, particularly preferably 0.02 mass % or more, extremely preferably 0.03 mass % or more, very preferably 0.05 mass % or more based on the total mass of the polishing liquid for CMP. In the case where the content of the saturated monocarboxylic acid is 0.001 mass % or more, it is easy to obtain the effect of the saturated monocarboxylic acid to achieve the stable polishing rate and the satisfactory in-plane uniformity. The content of the saturated monocarboxylic acid is preferably 5 mass % or less, more preferably 1 mass % or less, further preferably 0.5 mass % or less, particularly preferably 0.3 mass % or less, extremely preferably 0.1 mass % or less based on the total mass of the polishing liquid for CMP. In the case where the content of the saturated monocarboxylic acid is 5 mass % or less, the aggregation of the abrasive grain is more easily suppressed, and a high polishing rate and a satisfactory in-plane uniformity are more easily achieved, as compared with the case where it exceeds 5 mass %.

(Abrasive Grain)

The polishing liquid for CMP of the present embodiment comprises the abrasive grain including a cerium-based compound. The polishing liquid using the abrasive grain including the cerium-based compound has a feature that the polishing scratches occurring on the polished surface are relatively small in number. Polishing liquids comprising silica particle as abrasive grain have hitherto been widely used because high polishing rates of insulating materials is easily achieved. However, polishing liquids using silica particle generally suffer from a problem that polishing scratches easily occur on the polished surface. In a device having fine patterns since the generation of 45 nm in wire width, even fine scratches having hitherto caused no problems may affect the reliability of the device.

Herein, a polishing liquid using an abrasive grain including a cerium-based compound has hitherto had a tendency to be slightly lower in the polishing rate of an insulating material as compared with a polishing liquid using silica particle. However, in the present embodiment, the use of the above-described additives and the abrasive grain including the cerium-based compound in combination enables to achieve a high polishing rate of an insulating material. This suggests that the combination of the cerium-based compound and the above-described additives is particularly effective in polishing.

Examples of the cerium-based compound include cerium oxide, cerium hydroxide, cerium ammonium nitrate, cerium acetate, cerium sulfate hydrate, cerium bromate, cerium bromide, cerium chloride, cerium oxalate, cerium nitrate and cerium carbonate. Among these, cerium oxide is preferable. The use of an abrasive grain including cerium oxide enables to achieve a further higher polishing rate, and provides a polished surface small in the number of scratches and excellent in flatness.

It is preferable that the cerium oxide to be used as an abrasive grain includes polycrystalline cerium oxide having crystal grain boundary. It is considered that the polycrystalline cerium oxide particle having such a constitution is different from a simple aggregate in which single crystal particles aggregate, is made fine by the stress during polishing, and at the same time allows active surfaces (the surfaces not exposed to outside before being made fine) to appear one after another, so as for the high polishing rate of the insulating material to be highly maintained. Such a polycrystalline cerium oxide particle is described in detail in International Publication No. WO 99/31195.

The method for producing a cerium oxide particle is not particularly limited, but examples include liquid phase synthesis, firing, or a method performing oxidation by hydrogen peroxide. In the case where the polycrystalline cerium oxide having crystal grain boundary is obtained, the method in which the cerium source such as cerium carbonate is fired is preferable. The temperature during the firing is preferably 350 to 900° C. In the case where the produced cerium oxide particle aggregates, it is preferable to mechanically pulverize. The pulverizing method is not particularly limited, but for example, dry pulverization with a jet mill or the like, and wet pulverization with a planetary bead mill are preferable. As a jet mill, for example, it is possible to use a jet mill described in, for example, "Kagaku Kogaku Ronbunshu (Chemical Industrial Paper Collection)", Vol. 6, No. 5 (1980) pp. 527 to 532.

The average particle diameter of the abrasive grain is preferably 50 nm or more, more preferably 70 nm or more, further preferably 80 nm or more. In the case where the average particle diameter of the abrasive grain is 50 nm or more, the polishing rate of the insulating material can be further enhanced as compared with the case where the average particle diameter of the abrasive grain is less than 50 nm. The average particle diameter of the abrasive grain is preferably 500 nm or less, more preferably 300 nm or less, further preferably 280 nm or less, particularly preferably 250 nm or less, extremely preferably 200 nm or less. In the case where the average particle diameter of the abrasive grain is 500 nm or less, the polishing scratches can be suppressed as compared with the case where the average particle diameter of the abrasive grain exceeds 500 nm. For controlling the average particle diameter of the abrasive grain, it is possible to use the conventionally known methods, and by taking the cerium oxide particle as an example, examples include the control of the firing temperature, the firing time, the pulverization condition and the like; and the application of filtration, classification and the like.

The "average particle diameter of the abrasive grain" means a median of the volume distribution obtained by measuring a slurry sample including abrasive grains dispersed therein using a dynamic light scattering particle size distribution meter. Specifically, it is the value measured by using the LB-500 (trade name) manufactured by Horiba, Ltd. The content of the slurry sample is adjusted so that the content of the abrasive grain is 0.5 mass % based on the total mass of the slurry sample, and after setting it in the LB-500, the measurement of the median of the volume distribution is performed. Herein, the degree of the aggregation of the abrasive grain can also be evaluated by measuring the median diameter (cumulative median) with the LB-500. In the case where the particle diameter of the abrasive grain in the polishing liquid is measured, it is possible to measure in the same method as described above after adjusting the content of the slurry sample so that the content of the abrasive grain is 0.5 mass % based on the total mass of the slurry sample, by the concentration or water-dilution of the polishing liquid.

It is preferable that the zeta potential of the abrasive grain in the polishing liquid for CMP is positive. The "zeta potential" means the surface charge of the surface of the abrasive grain dispersed in the polishing liquid for CMP. When the zeta potential of the abrasive grain is positive, the abrasive grain easily acts on the insulating material, and the polishing rate of the insulating material can be further enhanced.

The zeta potential of the abrasive grain in the polishing liquid for CMP is preferably +10 mV or higher, more preferably +20 mV or higher, further preferably +30 mV or higher from the viewpoint that the stabilization of the dispersion state of the abrasive grain is facilitated. The upper limit of the zeta potential is not particularly limited, but is about +100 mV. The zeta potential can be measured by using, for example, the Delsa Nano C manufactured by Beckman Coulter, Inc.

(Water)

The water used for preparing the polishing liquid is not particularly limited, but is preferably deionized water, ion-exchanged water, ultrapure water and the like. Herein, if necessary, a polar solvent such as ethanol, acetic acid, and acetone or the like may be used in combination with water.

(Other Components)

The polishing liquid for CMP of the present embodiment can comprise a surfactant from the viewpoint of enhancing the dispersion stability of the abrasive grain and/or the flatness of the polished surface. Examples of the surfactant include an ionic surfactant and a nonionic surfactant, and a nonionic surfactant is preferable. Surfactant may be used alone or in combination of two or more.

Examples of the nonionic surfactant include ether-type surfactants such as polyoxypropylene polyoxyethylene alkyl ether, polyoxyethylene alkyl ether, polyoxyethylene alkylaryl ether, polyoxyethylene polyoxypropylene ether derivatives, polyoxypropylene glyceryl ether, polyethylene glycol, methoxypolyethylene glycol, and oxyethylene adducts of acethylene-based diols;

ester-type surfactants such as sorbitan fatty acid ester and glycerol borate fatty acid ester;

amino ether-type surfactants such as polyoxyethylene alkylamine;

ether ester-type surfactants such as polyoxyethylene sorbitan fatty acid ester, polyoxyethylene glycerol borate fatty acid ester and polyoxyethylene alkyl ester;

alkanolamide-type surfactants such as fatty acid alkanolamide and polyoxyethylene fatty acid alkanolamide;

oxyethylene adduct of acetylene-based diol; polyvinyl pyrrolidone; polyacrylamide; polydimethylacrylamide; and polyvinyl alcohol.

The polishing liquid for CMP of the present embodiment may further comprise components other than the surfactant in accordance with the desired characteristics. Examples of such a component include a pH adjuster, a pH buffer for suppressing the variation of pH, an aminocarboxylic acid, and a cyclic monocarboxylic acid, as described later. It is desirable that the content of these components fall within a range not to excessively lower the above effects due to the polishing liquid for CMP.

(pH)

The lower limit of the pH of the polishing liquid for CMP of the present embodiment is preferably 1.0 or more, more preferably 2.0 or more, further preferably 3.0 or more from the viewpoint that the polishing rate of the insulating material is easily maintained high. The upper limit of the pH of the polishing liquid for CMP of the present embodiment is preferably 9.0 or less, more preferably 8.0 or less, further preferably 7.0 or less, particularly preferably 6.0 from the viewpoint that the dispersion state of the abrasive grain is easily stabilized. Herein, the pH is defined as the pH at a liquid temperature of 25° C.

The pH of the polishing liquid can be adjusted by a pH adjuster such as an acid component such as an inorganic acid or an organic acid; or an alkali component such as ammonium, sodium hydroxide, tetramethylammonium hydroxide (TMAH) or imidazole. In addition, in order to stabilize the pH, a buffer may be added. In addition, the buffer may be added as a buffer solution (a liquid comprising the buffer). Examples of such a buffer solution include an acetate buffer solution and a phthalate buffer solution.

The pH of the polishing liquid for CMP of the present embodiment can be measured with a pH meter (for example, Model Number PHL-40 manufactured by Denki Kagaku Keiki Co., Ltd.). For example, after performing 2-point calibration of the pH meter using a phthalate pH buffer solution (pH 4.01) and a neutral phosphate pH buffer solution (pH 6.86) as standard buffer solutions, an electrode of the pH meter is placed in the polishing liquid for 2 minutes or more, and the value after stabilization is measured. In this case, the liquid temperature of each of the standard buffer solutions and the liquid temperature of the polishing liquid are both set to 25° C.

The polishing liquid for CMP of the present embodiment may be stored as a one-liquid polishing liquid comprising at least the abrasive grain, a 4-pyrone-based compound, a polymer compound having an aromatic ring and a polyoxyalkylene chain, a cationic polymer and water, or it may be stored as a two-liquid polishing liquid set (for example, a polishing liquid set for CMP) in which the constituents of the polishing liquid is separated to a slurry (first liquid) and an additive liquid (second liquid) so that the slurry and the additive liquid are mixed to provide the polishing liquid. The slurry comprises at least, for example, the abrasive grain and water. The additive liquid comprises at least, for example, the polymer compound having an aromatic ring and a polyoxyalkylene chain, the cationic polymer and water. Herein, the constituents of the polishing liquid may be stored as a polishing liquid set with being separated to three or more liquids.

The 4-pyrone-based compound and the saturated monocarboxylic acid may be comprised in either of the slurry and the additive liquid, but it is preferable that they are comprised in the slurry. For example, it is preferably separated to a slurry comprising at least the abrasive grain, the 4-pyrone-based compound (if necessary, the saturated monocarboxylic acid) and water and an additive liquid comprising at least the polymer compound having an aromatic ring and a polyoxyalkylene chain, the cationic polymer and water. This enables, for example, a use method in which the first polishing step described later is performed only with the slurry, and the second polishing step described later is performed with the polishing liquid for CMP obtained by mixing the slurry and the additive liquid.

In the polishing liquid set for CMP, immediately before the polishing or during the polishing, the slurry and the additive liquid are mixed to prepare the polishing liquid. Also, the one-liquid polishing liquid may be stored as a stock solution for the polishing liquid in which the content of water is reduced, and used with being diluted with water in polishing. The two-liquid polishing liquid set may be stored as a stock solution for the slurry and a stock solution for the additive liquid, in which the content of water is reduced, and used with being diluted with water in polishing.

In the case of the one-liquid polishing liquid, as the method of supplying the polishing liquid on a polishing platen, a method of directly sending the polishing liquid for supplying; a method of sending the stock solution for the polishing liquid and water through separate pipe arrangements, and converging these to mix for supplying; a method of mixing the stock solution for the polishing liquid and water in advance for supplying, or the like can be used.

In the case of storing as the two-liquid polishing liquid set in which the slurry and the additive liquid are separated, the ratio of these two liquids blended can be arbitrarily varied to thereby adjust the polishing rate. In the case of polishing using the polishing liquid set, examples of the method for supplying the polishing liquid on a polishing platen include methods shown below. For example, a method of sending the slurry and the additive liquid through separate pipe arrangements, and converging these pipe arrangements to mix for supplying; a method of sending the stock solution for the slurry, the stock solution for the additive liquid, and water through separate pipe arrangements, and converging these to mix for supplying; or a method of mixing the slurry and the additive liquid in advance for supplying; a method of mixing the stock solution for the slurry, the stock solution for the additive liquid, and water in advance for supplying can be used. Alternatively, a method of supplying each of the slurry and the additive liquid of the polishing liquid set on a polishing platen can also be used. In this case, the surface to be polished is polished using a polishing liquid obtained by mixing the slurry and the additive liquid on the polishing platen.

<Polishing Method>

The polishing method of the present embodiment comprises a step of polishing a base substrate (for example, a substrate) including an insulating material by using the polishing liquid for CMP. For example, in the polishing step, while the insulating material is pressed on a polishing pad, and the polishing liquid is supplied between the insulating material and the polishing pad, at least either of the base substrate and the polishing pad is moved to polish the insulating material with the polishing pad. In the polishing step, for example, by using the polishing liquid in which the contents of the respective components, the pH and the like are adjusted, the base substrate having the insulating material at the surface thereof is flattened by the CMP technique.

The polishing method of the present embodiment is suitable for polishing the base substrate having the insulating material at the surface thereof in the production process of a device. Examples of the device include discrete semiconductors such as diode, transistor, compound semiconductor, thermistor, varistor and thyristor; memory elements such as DRAM (dynamic random access memory), SRAM (static random access memory), EPROM (erasable programmable read only memory), mask ROM (mask read only memory), EEPROM (electrical erasable programmable read only memory) and flash memory; logic circuit elements such as microprocessor, DSP and ASIC; compound semiconductor integrated circuit elements typified by MMIC (monolithic microwave integrated circuit); hybrid integrated circuit (hybrid IC); and photoelectric conversion elements such as light emitting diode and charge coupled device element.

The polishing liquid for CMP of the present embodiment can achieve a high polishing rate of the insulating material without significantly depending on the state of the surface to be polished. Therefore, the polishing method using the aforementioned polishing liquid can be applied to a base substrate for which a high polishing rate cannot be achieved by a method using a conventional polishing liquid for CMP.

The polishing method of the present embodiment is particularly suitable for the flattening of a surface to be polished having step heights (irregularities) on the surface. Examples of a base substrate having such a surface to be polished include a logic semiconductor device. In addition, this polishing method is suitable for polishing a surface including portions in which concave regions or convex regions are T-shaped or lattice shaped as viewed from above. For example, it is also possible to polish at a high rate the insulating material provided on the surface of a semiconductor device having a memory cell (for example, DRAM, or flash memory). These are the objects for which a method using a conventional polishing liquid for CMP finds difficulty in achieving a high polishing rate, and it is shown that the polishing liquid for CMP of the present embodiment can achieve a high polishing rate without significantly depending on the irregular shape of the surface to be polished.

The polishing method of the present embodiment is suitable for the polishing method in which polishing is stopped at the stage where the insulating material is polished to allow the stopper to be exposed. The reason for this is because the polishing liquid for CMP can achieve a high polishing rate of the insulating material and a high stopping property of the stopper material. The polishing method of the present embodiment can selectively polish the insulating material with respect to the stopper material. The polishing rate ratio of the insulating material with respect to the stopper material is preferably 30 or more, more preferably 50 or more, further preferably 100 or more.

Examples of the insulating material include an inorganic insulating material and an organic insulating material. Examples of the inorganic insulating material include silicon-based insulating materials. Examples of the silicon-based insulating material include silica-based materials such as silicon oxide, fluorosilicate glass, organosilicate glass and hydrogenated silsesquioxane; silicon carbide; and, silicon nitride. In the insulating material, an element such as phosphorus or boron may be doped. Examples of the organic insulating material include wholly aromatic based low dielectric constant insulating materials. The insulating material is preferably an inorganic insulating material, more preferably a silicon-based insulating material, further preferably silicon oxide from the viewpoint of achieving a further high polishing rate.

Examples of the stopper material constituting the stopper include silicon nitride and polysilicon, and polysilicon is preferable from the viewpoint of achieving high stopping property.

The base substrate to which the polishing method is applicable is not limited to the base in which the whole surface to be polished is formed of silicon oxide, but may be a base further having, in addition to silicon oxide, silicon nitride, polysilicon and the like at the surface thereof. In addition, the polishing method is also applicable to a base substrate in which there is formed an inorganic insulating film such as a silicon oxide film, a glass film or a silicon nitride film, or a film mainly containing polysilicon, Al, Cu, Ti, TiN, W, Ta, TaN or the like, on a wiring board having a predetermined wiring.

With reference to FIG. 1, the process for forming a shallow trench isolation (STI) structure on a substrate (wafer) by the CMP based on the polishing method of the present embodiment is described. The polishing method of the present embodiment may comprise a first polishing step (coarse polishing step) of polishing a silicon oxide film 3 at a high rate, and a second polishing step (finishing step) of polishing the residual silicon oxide film 3 at a relatively low rate.

FIG. 1(*a*) is a cross-sectional view illustrating a substrate before polishing FIG. 1(*b*) is a cross-sectional view illustrating the substrate after a first polishing step. FIG. 1(*c*) is a cross-sectional view illustrating the substrate after a second polishing step. As shown in these figures, in the process for forming the STI structure, in order to eliminate the step height D of the silicon oxide film 3 formed on a silicon substrate 1, unnecessary partially protruding portions are preferentially removed by CMP. Herein, in order to appropriately stop the polishing at the point of time where the surface is flattened, it is preferable that a polysilicon film (stopper film) 2 having slow polishing rate is beforehand formed under the silicon oxide film 3. By passing through the first polishing step and the second polishing step, the step height D of the silicon oxide film 3 is eliminated, and therefore, an element isolation structure having an embedded portion 5 is formed.

In the polishing of the silicon oxide film 3, the substrate (wafer) is disposed on the polishing pad in such a way that the surface of the silicon oxide film 3 and the polishing pad have contact with each other, and the surface of the silicon oxide film 3 is polished with the polishing pad. More specifically, while the surface to be polished side of the silicon oxide film 3 is being pressed to the polishing pad on the polishing platen, and the polishing liquid for CMP is being supplied between the surface to be polished and the polishing pad, both of these are relatively moved to polish the silicon oxide film 3.

The polishing liquid for CMP of the present embodiment can be applied to either of the first polishing step and the second polishing step; however, it can achieve a high polishing rate, and thus, it is particularly preferable to use in the second polishing step.

Herein, the case where the polishing step is performed as divided into two stages is described as an example, but the polishing process from the state shown in FIG. 1(a) to the state shown in FIG. 1(c) can be performed as a single stage.

As the polishing apparatus, for example, an apparatus provided with a holder for holding a base substrate, a polishing platen to which a polishing pad is attached, and a means to supply a polishing liquid to the polishing pad is appropriate. Examples include the polishing apparatuses (Model Numbers: EPO-111, EPO-222, FREX200, FREX300) manufactured by Ebara Corp., and the polishing apparatus (trade name: Mirra 3400, Reflexion Polishing Machine) manufactured by Applied Materials, Inc. As the polishing pad, it is possible to use, for example, common unwoven cloth, foamed polyurethane or porous fluororesin, without particularly being limited. It is preferable that the polishing pad is subjected to grooving so that the polishing liquid is pooled.

Polishing conditions are not particularly limited, but the rotation speed of the platen is preferably 200 $min^{-1}$ or less from the viewpoint that the base substrate is not let out. The pressure to be applied to the base substrate (processing load) is preferably 100 kPa or less from the viewpoint of suppressing polishing scratches. It is preferable to continuously supply the polishing liquid to the polishing pad by a pump or the like during polishing. The amount of supply thereof is not limited, but it is preferable that the surface of the polishing pad is always covered with the polishing liquid.

It is preferable that, after completion of the polishing, the base substrate is sufficiently washed with flowing water, then a spin dryer or the like is used to flick a water droplet attached to the base substrate, and then drying is performed. By polishing in this way, it is possible to eliminate the irregularities on the surface to obtain a flat and smooth surface overall the surface of the base substrate. By repeating the step of forming and polishing the film a predetermined number of times, it is possible to produce a base substrate having a desired number of layers.

The base substrate obtained in this way can be used as various electronic components. Specific examples include semiconductor elements, optical glass for a photomask, a lens, a prism or the like, inorganic conductive films of ITO or the like, optical integrated circuits/optical switching elements/optical waveguides constituted with glass and crystalline materials, end faces of optical fibers, optical single crystals such as scintillators, solid laser single crystals, sapphire substrates for blue laser LEDs, semiconductor single crystals of SiC, GaP, GaAs and the like, glass substrates for magnetic discs, and magnetic heads.

EXAMPLES

Hereinafter, the present invention is described in more detail by way of Examples, but the present invention is not limited to these Examples.

[Preparation of Abrasive Grain]

In an alumina vessel, 40 kg of cerium carbonate hydrate was placed, and fired at 830° C. for 2 hours in the air to obtain 20 kg of a yellowish-white powder. The phase identification of this powder was performed by an X-ray diffraction method, and it was confirmed that the powder included polycrystalline cerium oxide. The particle diameter of the powder obtained by firing was observed with a SEM and was found to be 20 to 100 μm. Then, 20 kg of the cerium oxide powder was dry pulverized using a jet mill. The cerium oxide powder after the pulverization was observed with a SEM, and was found to include polycrystalline cerium oxide particles having crystal boundary. In addition, the specific surface area was found to be 9.4 $m^2/g$. The measurement of the specific surface area was performed by the BET method.

[Preparation of Polishing Liquid for CMP]

In a vessel, 150 g of the cerium oxide powder (abrasive grain) obtained above and 849.8 g of deionized water were placed and mixed. In addition, 0.2 g of acetic acid was added to adjust the pH to 4.5 and was stirred for 10 minutes. The obtained slurry was send to another vessel over 30 minutes. Meanwhile, in the sending pipe arrangement, the slurry was irradiated with ultrasonic wave at an ultrasonic frequency of 400 kHz.

The slurry was taken in each of two 500 mL beakers in an amount of 500 g±20 g and centrifugation was performed. The centrifugation was performed for 2 minutes under the conditions that the centrifugal force exerted to the outer circumference was 500 G The solid phase (precipitated abrasive grain) was left at the bottom of the beaker, and the liquid phase (the liquid including the abrasive grain not precipitated) was collected. Deionized water was added to the liquid phase to adjust the content of the abrasive grain so as to be 0.5 mass % based on the total mass of the slurry, and thus a sample for the measurement of the average particle diameter was obtained. The average particle diameter of the abrasive grain was measured using a dynamic light scattering particle size distribution analyzer [trade names: LB-500, manufactured by Horiba, Ltd.], and consequently the average particle diameter was found to be 150 nm.

Example 1

An adjustment was made using deionized water so that the content of the abrasive grain was 5.0 mass %, the content of 3-hydroxy-2-methyl-4-pyrone as the first additive was 0.7 mass %, and the content of propionic acid as the fourth additive was 0.9 mass %, to obtain the stock solution for the slurry. The pH of the stock solution for the slurry was 3.0. The pH was measured using the Model Number PHL-40 manufactured by Denki Kagaku Keiki Co., Ltd.

An adjustment was made using deionized water so that the content of polyoxyethylene styrenated-phenyl ether as the second additive was 5 mass %, and the content of diallyldimethylammonium chloride/acrylamide copolymer as the third additive was 0.0015 mass %, and the pH was adjusted using an aqueous ammonia solution, to obtain the stock solution for the additive liquid. The pH of the stock solution for the additive liquid was 5.7. The pH was measured using the Model Number PHL-40 manufactured by Denki Kagaku Keiki Co., Ltd.

A polishing liquid was obtained by mixing the stock solution for the slurry, the stock solution for the additive liquid and deionized water in a mass ratio of 1:1:8. In the polishing liquid, the stock solution for the slurry and the stock solution for the additive liquid were diluted 10-fold. The pH of the polishing liquid was 3.5. The pH was measured using the Model Number PHL-40 manufactured by Denki Kagaku Keiki Co., Ltd.

Examples 2 to 12 and Comparative Examples 1 to 4

The stock solutions for the slurry and the stock solutions for the additive liquid were prepared by using the abrasive grain obtained above and the additives shown in Table 1 presented below in the same manner as in Example 1, and were mixed with deionized water, to prepare the polishing liquids in each of which the content of the abrasive grain was 0.5 mass % and the content of 4-pyrone-based compound was 0.07 mass %. In Examples 2 and 3, in the preparation of the additive liquids, aqueous ammonia was used as the pH adjuster.

[Zeta Potential]

As the measurement apparatus, the Delsa Nano C manufactured by Beckman Coulter, Inc. was used, each of the polishing liquids for CMP was subjected to centrifugation so that the scattering intensity of the measurement sample in the measurement apparatus was $1.0\times10^4$ to $5.0\times10^4$ cps, and the liquid phase was obtained as a measurement sample. The specific centrifugation conditions were such that the centrifugal force exerted to the outer circumference was 500 G and the centrifugation time was 10 minutes. Then, after each of the measurement samples was placed in a zeta potential measurement cell, the zeta potential was measured. The measurement results are shown in Table 1.

[Evaluation of CMP]

By using each of the polishing liquids for CMP, a substrate to be polished was polished under the following polishing conditions.

(CMP Polishing Conditions)
Polishing apparatus: Reflexion (manufactured by Applied Materials, Inc.)
Flow rate of polishing liquid for CMP: 250 mL/min
Substrate to be polished: "blanket wafer" described below
Polishing pad: foamed polyurethane resin having closed pores (Model Number IC1010 produced by Rohm and Haas Japan K.K.)
Polishing pressure: 20.6 kPa (3.0 psi)
Rotation speed of substrate and polishing platen: 100 $\text{min}^{-1}$ (rpm)
Polishing time: blanket wafer was polished for 30 seconds (0.5 min).

(Blanket Wafer)

As the blanket wafer, a substrate obtained by forming a silicon oxide film having a thickness of 1 μm (10000 Å) on a silicon substrate by a plasma CVD method, and a substrate obtained by forming a polysilicon film having a thickness of 0.2 μm (2000 Å) on a silicon substrate by a CVD method were used.

(Evaluation of Polished Product: Polishing Rate and Polishing Selecting Ratio)

For the polished substrate which was polished under the above-described conditions, the polishing rate of each of the films to be polished (silicon oxide film and polysilicon film) was determined by the following expression. Herein, the difference in thickness of each of the films to be polished, between before and after polishing, was determined using a light interference-type film thickness apparatus (trade name: F80 manufactured by Filmetrics Japan Inc.). In addition, the polishing selectivity of the silicon oxide film with respect to the polysilicon film (polishing rate ratio: polishing rate of silicon oxide film/polishing rate of polysilicon film) was calculated. The measurement results are shown in Table 1.

(Polishing rate)=(difference in film thickness (Å) of each of the films to be polished between before and after polishing)/(polishing time (min))

TABLE 1

| | Abrasive grain Zeta potential (mV) | First additive Type | Second additive | | Third additive | | Fourth additive | | pH adjustment | pH | Polishing rate (Å/min) | | Polishing selecting ratio Silicon oxide/polysilicon |
|---|---|---|---|---|---|---|---|---|---|---|---|---|---|
| | | | Type | Content (mass %) | Type | Content (mass %) | Type | Content (mass %) | | | Silicon oxide | Poly-silicon | |
| Example 1 | 60 | A-1 | B-1 | 0.5 | C-1 | 0.00015 | D-1 | 0.09 | Not applied | 3.5 | 9000 | 90 | 100 |
| Example 2 | 45 | A-1 | B-1 | 0.5 | C-1 | 0.00015 | D-1 | 0.09 | Applied | 4.5 | 9200 | 70 | 131 |
| Example 3 | 30 | A-1 | B-1 | 0.5 | C-1 | 0.00015 | D-1 | 0.09 | Applied | 5.5 | 9400 | 45 | 209 |
| Example 4 | 55 | A-1 | B-1 | 1.0 | C-1 | 0.00015 | D-1 | 0.09 | Not applied | 3.5 | 8100 | 86 | 94 |
| Example 5 | 65 | A-1 | B-1 | 0.1 | C-1 | 0.00015 | D-1 | 0.09 | Not applied | 3.5 | 8000 | 95 | 84 |
| Example 6 | 65 | A-1 | B-1 | 0.5 | C-1 | 0.00008 | D-1 | 0.09 | Not applied | 3.5 | 8000 | 95 | 84 |
| Example 7 | 50 | A-1 | B-1 | 0.5 | C-1 | 0.00030 | D-1 | 0.09 | Not applied | 3.5 | 7500 | 70 | 107 |
| Example 8 | 60 | A-1 | B-2 | 0.5 | C-1 | 0.00015 | D-1 | 0.09 | Not applied | 3.5 | 8000 | 95 | 84 |
| Example 9 | 60 | A-1 | B-1 | 0.5 | C-2 | 0.00015 | D-1 | 0.09 | Not applied | 3.5 | 7300 | 70 | 104 |
| Example 10 | 60 | A-1 | B-1 | 0.5 | C-3 | 0.00015 | D-1 | 0.09 | Not applied | 3.5 | 8800 | 96 | 92 |
| Example 11 | 60 | A-1 | B-1 | 0.5 | C-1 | 0.00015 | None | None | Not applied | 5.0 | 7000 | 90 | 78 |
| Example 12 | 60 | A-2 | B-1 | 0.5 | C-1 | 0.00015 | D-1 | 0.09 | Not applied | 3.5 | 7000 | 70 | 100 |
| Comparative Example 1 | 65 | A-1 | B-1 | 0.5 | — | — | D-1 | 0.09 | Not applied | 3.5 | 7000 | 250 | 28 |
| Comparative Example 2 | 65 | A-1 | — | — | C-1 | 0.00015 | D-1 | 0.09 | Not applied | 3.5 | 2500 | 25 | 100 |
| Comparative Example 3 | 70 | A-1 | — | — | — | — | D-1 | 0.09 | Not applied | 3.3 | 8000 | 720 | 11 |
| Comparative Example 4 | 60 | A-1 | B-3 | 0.5 | C-1 | 0.00015 | D-1 | 0.09 | Not applied | 3.5 | 5000 | 220 | 23 |

Herein, the details of the additives in Table 1 are as follows.

A-1: 3-Hydroxy-2-methyl-4-pyrone

A-2: 5-Hydroxy-2-(hydroxymethyl)-4-pyrone

B-1: Polyoxyethylene styrenated-phenyl ether (trade name: Emulgen A-500, produced by Kao Corporation, weight average molecular weight: 4500 to 5000)

B-2: Polyoxyethylene alkylphenyl ether (trade name: Emulsit, produced by Dai-ichi Kogyo Seiyaku Co., Ltd., weight average molecular weight: 3000 to 3500)

B-3: Polyethylene glycol (trade name: PEG600, produced by Lion Corp. weight average molecular weight: 600)

C-1: Diallyldimethylammonium chloride/acrylamide copolymer (trade name: PAS-J-81, produced by Nittobo Medical Co., Ltd., weight average molecular weight: 200000)

C-2: Polyallylamine (trade name: PAA-01, produced by Nittobo Medical Co., Ltd., weight average molecular weight: 1600)

C-3: Diallyldimethylammonium chloride polymer (trade name: PAS-H-10L, produced by Nittobo Medical Co., Ltd., weight average molecular weight: 200000)

D-1: Propionic acid

As is clear from Table 1, in Examples 1 to 12, as compared with Comparative Examples 1 to 4, a high polishing rate of the insulating material (silicon oxide) and a high stopping property of the stopper material (polysilicon) are allowed to be compatible with each other.

REFERENCE SIGNS LIST

1 . . . Silicon substrate, 2 . . . Polysilicon film, 3 . . . Silicon oxide film, 5 . . . Embedded portion, D . . . Step height.

The invention claimed is:

1. A polishing liquid for CMP, comprising:
an abrasive grain including a cerium-based compound;
a 4-pyrone-based compound represented by the following general formula (I):

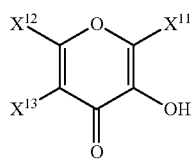

(I)

wherein, in general formula (I), $X^{11}$, $X^{12}$ and $X^{13}$ are each independently a hydrogen atom or a monovalent substituent;
a polymer compound having an aromatic ring and a polyoxyalkylene chain;
a cationic polymer; and
water.

2. The polishing liquid according to claim 1, wherein a zeta potential of the abrasive grain in the polishing liquid is positive.

3. The polishing liquid according to claim 1, wherein the 4-pyrone-based compound is at least one selected from the group consisting of 3-hydroxy-2-methyl-4-pyrone, 5-hydroxy-2-(hydroxymethyl)-4-pyrone, and 2-ethyl-3-hydroxy-4-pyrone.

4. The polishing liquid according to claim 1, further comprising a saturated monocarboxylic acid.

5. The polishing liquid according to claim 4, wherein the number of carbon atoms of the saturated monocarboxylic acid is 2 to 6.

6. The polishing liquid according to claim 4, wherein the saturated monocarboxylic acid is at least one selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid.

7. The polishing liquid according to claim 1, wherein the polishing liquid is preserved with being separated to a first liquid and a second liquid,
the first liquid contains at least the abrasive grain and water, and
the second liquid contains at least the polymer compound, the cationic polymer and water.

8. A polishing method comprising a step of polishing a base substrate having an insulating material by using the polishing liquid according to claim 1.

9. The polishing liquid according to claim 1, wherein the polymer compound having an aromatic ring and a polyoxyalkylene chain has an aromatic group including a styrene group.

10. The polishing liquid according to claim 1, wherein the polymer compound having an aromatic ring and a polyoxyalkylene chain is a compound represented by the following general formula (II) or general formula (III)

(II)

wherein, in formula (II), $R^{11}$ represents an aryl group which may have a substituent, $R^{12}$ represents an alkylene group having 1 to 5 carbon atoms, which may have a substituent, and m represents an integer of 15 or more,

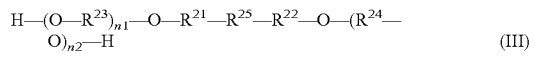

(III)

wherein, in formula (III), $R^{21}$ and $R^{22}$ each independently represent an arylene group which may have a substituent, $R^2$, $R^{24}$ and $R^{25}$ each independently represent an alkylene group having 1 to 5 carbon atoms, which may have a substituent, and n1 and n2 each independently represent an integer of 15 or more.

11. The polishing liquid according to claim 10, wherein the polymer compound having an aromatic ring and a polyoxyalkylene chain is a compound represented by the general formula (II), and $R^{11}$ is a phenyl group to which a styrene group or an alkyl group is introduced as a substituent.

* * * * *